United States Patent
Arora et al.

(10) Patent No.: US 11,594,694 B2
(45) Date of Patent: Feb. 28, 2023

(54) INORGANIC HOLE CONDUCTOR BASED PEROVSKITE PHOTOELECTRIC CONVERSION DEVICE WITH HIGH OPERATIONAL STABILITY AT LONG TERM

(71) Applicant: Ecole Polytechnique Federale de Lausanne (EPFL), Lausanne (CH)

(72) Inventors: Neha Arora, Cambridge (GB); Mohammad Ibrahim Dar, Cambridge (GB); Shaik Mohammed Zakeeruddin, Bussigny-Lausanne (CH); Michael Graetzel, St-Sulpice (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 589 days.

(21) Appl. No.: 16/610,027

(22) PCT Filed: May 3, 2018

(86) PCT No.: PCT/IB2018/053090
§ 371 (c)(1),
(2) Date: Oct. 31, 2019

(87) PCT Pub. No.: WO2018/203279
PCT Pub. Date: Nov. 8, 2018

(65) Prior Publication Data
US 2020/0111981 A1    Apr. 9, 2020

(30) Foreign Application Priority Data

May 5, 2017  (EP) .................................. 17169831

(51) Int. Cl.
*H01L 51/42* (2006.01)
*H01L 51/00* (2006.01)
*H01L 51/50* (2006.01)

(52) U.S. Cl.
CPC ........ *H01L 51/424* (2013.01); *H01L 51/0003* (2013.01); *H01L 51/0083* (2013.01);
(Continued)

(58) Field of Classification Search
CPC ............... H01L 51/424; H01L 51/0003; H01L 51/0083; H01L 51/0084; H01L 51/0089
See application file for complete search history.

(56) References Cited

U.S. PATENT DOCUMENTS

2007/0068571 A1\*  3/2007  Li .................... H01L 31/0488
                                                              136/258
2015/0136232 A1\*  5/2015  Snaith ................ C07F 7/2284
                                                              252/512

(Continued)

FOREIGN PATENT DOCUMENTS

WO      2016014845 A1    1/2016

OTHER PUBLICATIONS

Schulz et al., "High-Work-Function Molybdenum Oxide Hole Extraction Contacts in Hybrid Organic-Inorganic Perovskite Solar Cells ", ACS Appl. Mater. Interfaces 2016, 8, 31491-31499. (Year: 2016).\*

(Continued)

*Primary Examiner* — Tae-Sik Kang
(74) *Attorney, Agent, or Firm* — Taft Stettinius & Hollister LLP

(57) ABSTRACT

The invention relates to an optoelectronic and/or photoelectrochemical device including a conductive support layer, n-type semiconductor, a sensitizer or light-absorber layer, a hole transporting layer, a spacer layer and a back contact, wherein the n-type semiconductor is in contact with the sensitizer or light-absorber layer, the sensitizer or light-absorber layer includes a perovskite or metal halide perovskite material, the hole transporting layer is in direct contact with the sensitizer or light-absorber layer and includes an (Continued)

inorganic hole transporting material or inorganic p-type semiconductor, the spacer layer is between the hole transporting layer and the back contact and includes a material being different from the inorganic hole transporting material and the material of the back contact.

11 Claims, 7 Drawing Sheets

(52) U.S. Cl.
CPC ...... *H01L 51/0084* (2013.01); *H01L 51/0089* (2013.01); *H01L 51/0091* (2013.01); *H01L 51/5056* (2013.01); *H01L 2251/308* (2013.01)

(56) References Cited

U.S. PATENT DOCUMENTS

2016/0365525 A1* 12/2016 Sugimura ............. H01L 51/005
2017/0324053 A1* 11/2017 Tabet ................... C01G 23/047

OTHER PUBLICATIONS

International Search Report; European Patent Office; International Application No. PCT/IB2018/053090; dated Jul. 27, 2018; 4 pages.
Written Opinion of the International Searching Authority; European Patent Office; International Application No. PCT/IB2018/053090; dated Jul. 27, 2018; 5 pages.
Schmidt et al.; Upscaling of Perovskite Solar Cells: Fully Ambient Roll Processing of Flexible Perovskite Solar Cells with Printed Back Electrodes; Advanced Energy Materials; 2015; 9 pages; Copyright 2015 WILEY-VCH Verlag GmbH & Co. KGaA, Weinheim.
Christians et al.; An Inorganic Hole Conductor for Organo-Lead Halide Perovskite Solar Cells. Improved Hole Conductivity with Copper Iodide; Journal of the American Chemical Society (JACS): 2014; 7 pages; Copyright 2013 American Chemical Society.

* cited by examiner

INORGANIC HOLE CONDUCTOR BASED PEROVSKITE PHOTOELECTRIC CONVERSION DEVICE WITH HIGH OPERATIONAL STABILITY AT LONG TERM

The project leading to this application has received funding from the European Union's Horizon 2020 Research and Innovation Program under grant Agreement No. 687008 and from Graphene Flagship Corel under Agreement No. 69656.

CROSS REFERENCE TO RELATED APPLICATIONS

This application is a U.S. national stage filing of International Patent Application No. PCT/IB2018/053090 filed May 3, 2018, which claims priority to European Application No. 17169831.9 filed May 5, 2017, the contents of each application hereby incorporated by reference in their entirety.

TECHNICAL FIELD

This invention generally relates to photoelectric conversion devices and organic-inorganic perovskite based photoelectric conversion devices, in particular organic-inorganic perovskite based solar cells, comprising inorganic hole conductor and a spacer layer between said hole conductor layer and the back contact, being highly stable at long ter p and maintaining over 90% of initial efficiency at long term.

PRIOR ART AND THE PROBLEM UNDERLYING THE INVENTION

The conversion of solar energy to electrical current using thin film third generation photovoltaics (PV) is being widely explored for the last two decades. The sandwich/monolithic-type PV devices, consisting of a mesoporous photoanode with an organic/inorganic light harvester, redox electrolyte/solid-state hole conductor, and counter electrode, have gained significant interest due to the ease of fabrication, flexibility in the selection of materials and cost effective. Further the organometallic halide perovskite based on tin ($CsSnX_3$), or lead ($CH_3NH_3PbX_3$; X=Cl, Br, I) have been introduced in the place of traditional metal-organic complex or organic molecules as the light harvester. Organic-inorganic hybrid lead halide or metal halide perovskite photovoltaics presently attract enormous research interest due to their low cost of fabrication and materials and high solar to electric power conversion efficiency (PCE). Over the past five years the PCE of the perovskite solar cells (PSCs) raises steeply from about 3% to 22.0%, which is unprecedented in the field of photovoltaics.

The prominence of organic-inorganic perovskite solar cells (PSCs) can be credited to the unprecedented advancement in the power conversion efficiencies (PCEs), realized mostly by tailoring the formation and composition of the absorber layer.

A common organic-inorganic perovskite solar cell comprises a pair of electrodes and perovskite active layer and charge transporting materials disposed there between. The perovskite layer, either with or without mesoporous scaffold, is sandwiched between the electron and hole transport layers (n-type and p-type, respectively). Following light excitation, carriers are created in the perovskite layer and injects negative and positive charge carrier in the respective electron and hole transport materials, which subsequently are collected as photocurrent at the front and back contacts of the cell. There are two types of architecture: PSC with a conventional architecture or PSC with an inverted architecture. In a PSC with a conventional architecture, the perovskite layer, either with or without mesoporous scaffold, is sandwiched between the electron layer on the side of the transparent front contact and a hole transport layer, which are in contact (indirectly or directly) with the counter electrode. In a PSC with an inverted architecture, the perovskite layer is sandwiched between an electron blocking layer or hole collector layer on the side of the transparent front contact and a hole blocking layer which may be in contact with the counter or metal electrode.

The fabrication of hole transport layer is strictly dominated by the prepared active layer which is generally sensitive to temperature, humidity and the solvent. For these reason, organic hole transport materials with excellent film processability become a better choice for this kind of device. Certified PCEs of over 20% have been obtained while retaining the electron selective $TiO_2$ layer and by using either spiro-OMeTAD [2,2',7,7'-tetrakis(N,N-di-p-methoxyphenyl-amine)9,9'-spirobifluorene] or a polymer-based PTTA (poly-triarylamine) as the hole-transporting material (HTM). However, the cost of these HTMs is prohibitively high for large-scale applications and the long-term operational and thermal instability seems to be associated with the archetype organic HTMs or their ingredients. One of the strategies to overcome the issues of cost and instability could be the use of inexpensive inorganic hole extraction layers.

Therefore the use of inorganic HTMs such as NiO, CuI, $CsSnI_3$, and CuSCN are more advantageous in respect of cost and durability. However, the use of inorganic HTMs in this type of devices provides very poor performance. And obtaining stable PCEs over 20% with PSCs using inorganic HTMs, when subjected to light soaking under realistic operational conditions, i.e. at maximum power point and elevated temperature, has remained a challenge.

Different approaches have been undertaken to improve the performance of PSCs. One of these approaches concern the use of different deposition methods of the inorganic hole conductor including doctor blading, electrodeposition, spin coating, and spray coating. Of those, the solution-based bottom-up approaches are more facile. However, a critical issue associated with the solution-based approaches is that most of the solvents in which the inorganic hole conductor shows high solubility, degrade the perovskite layer. Further, because the dearth of solvents that readily dissolve inorganic hole conductors (CuSCN e.g.) and not the perovskite, inverted device architecture has been employed albeit with moderate success.

The present invention addresses the problems of the high cost of the use of organic HTM such as e.g. spiro-OMeTAD [2,2',7,7'-tetrakis(N,N-di-p-methoxyphenyl-amine)9,9'-spirobifluorene] or a polymer-based PTTA (poly-triarylamine) as the hole-transporting material (HTM).

The present invention addresses the problems of the use of inorganic hole conductor or p-type semiconductor in PSCs, the degradation of the perovskite and the instability of the device due to the use of such hole conductor and the presence of solvent dissolving the perovskite.

The present invention addresses the problems of the long-term stability of PSCs with inorganic hole conductor, in particular the thermal stability under long-term heat stress.

The present invention addresses the problems depicted above.

SUMMARY OF THE INVENTION

The inventors surprisingly found that the introduction of a spacer layer in a PSC comprising organic-inorganic perovskite and an inorganic hole conductor as HTM, in particular CuSCN improves the performance of a PSC having an inorganic hole conductor. They remarked that a spacer layer comprising reduced graphene oxide (rGO) between the metal or back contact of the device and the HTM layer comprising inorganic hole conductor prevents the dramatic loss of PCE of such PSCs after a treatment of continuous illumination and thermal stress. The presence of such spacer layer improves the long-term stability of a PSC comprising inorganic hole conductor to the point that the stability of such a device surpasses the stability of spiro-OMeTAD based PSCs.

In one aspect, the present invention provides an optoelectronic and/or photovoltaic or photoelectrochemical device comprising a conductive support layer, n-type semiconductor, a sensitizer or light-absorber layer, a hole transporting layer, a spacer layer and a back contact, wherein the n-type semiconductor is in contact with the sensitizer or light-absorber layer, the sensitizer or light-absorber layer comprises an organic-inorganic perovskite or metal halide perovskite material, the hole transporting layer is in direct contact with the sensitizer or light-absorber layer and comprises an inorganic hole transporting material or inorganic p-type semiconductor, the spacer layer is between the hole transporting layer and the back contact and comprises a material being different from the inorganic hole transporting material and the material of the back contact.

In another aspect the invention provides a method for manufacturing an optoelectronic and/or photovoltaic or photoelectrochemical device comprising:
  providing a conductive support layer,
  providing a n-type semiconductor onto the conductive support layer,
  providing a sensitizer or light-absorber layer comprising a perovskite or metal halide perovskite material onto the n-type semiconductor,
  providing a hole transporting layer onto the sensitizer followed by the application of a spacer layer,
  providing a counter or back contact electrode on the spacer layer,
    wherein the hole transporting layer comprises an inorganic hole transporting material or inorganic p-type semiconductor and is deposited by dynamic deposition method onto the sensitizer or light-absorber layer, said dynamic deposition method comprising depositing the inorganic hole transporting material or inorganic p-type semiconductor in solution onto the sensitizer or light-absorber layer by a method selected from drop-casting, doctor blading, electrodeposition, spin coating, or spray coating, while spinning the conductive support layer supporting the n-type semiconductor and the sensitizer or light-absorber layer; and
  the spacer layer comprises a material being different from the inorganic hole transporting material and the material of the back contact.

Further aspects and preferred embodiments of the invention are detailed herein below and in the appended claims. Further features and advantages of the invention will become apparent to the skilled person from the description of the preferred embodiments given below.

BRIEF DESCRIPTION OF THE DRAWINGS

FIG. 1a: a transparent conductive substrate (FTO), n-type semiconductor comprising a compact metal oxide layer ($TiO_2$) and a mesoporous inorganic n-type semiconductor layer ($TiO_2$) as scaffold structure for the perovskite material, perovskite layer, a hole transporting layer (CuSCN), and a back contact (Au); FIG. 1b: the same framework as in FIG. 1a with the spacer layer.

FIG. 2a: GIXD data acquired from pure CuSCN on glass, CuSCN on perovskite/$TiO_2$/FTO and bare perovskite/$TiO_2$/FTO. At the bottom, calculated powder diffraction data from CuSCN is shown for comparison. Indexing of CuSCN pattern is performed according to the CuSCN 2H β-structure (black vertical lines correspond to the substrate). FIG. 2b: GIWAXS data from CuSCN FIG. 2b: GIWAXS data from CuSCN+perovskite. In FIG. 2c: the (002) reflection is clearly visible. Other reflections are super-imposed with more intense reflections from perovskite film. FIGS. 2d and 2e: Images depict the preferential out-of-plane orientation, (the in-plane orientation is rotated by 90°); the red balls represent copper atoms, the yellow balls represent sulfur atoms, the grey balls represent carbon atoms, and the blue balls represent nitrogen atoms. FIG. 2f shows the intensity distribution of β-CuSCN: Angular distribution of intensity from the CuSCN (002) reflection on glass (black curve or top curve) and on perovskite (blue curve or down curve) after background subtraction. (0° is parallel to the substrate plane; 90° is perpendicular).

FIG. 3a, Top-view SEM micrograph of the perovskite film deposited onto mesoporous $TiO_2$ showing the presence of perovskite grains. FIG. 3b, Top-view SEM micrograph showing the formation of uniform CuSCN layer deposited onto perovskite film. FIG. 3c, Cross-sectional SEM micrograph displaying the thickness of different layers of the complete device. FIG. 3d, Steady-state PL spectra showing strong quenching of intense PL exhibited by the pristine perovskite film. FIG. 3e, TCSPC showing long lasting charge carriers in pristine perovskite film and the very rapid injection of charges from the perovskite film into the electron and hole extraction layers. (The color code for FIGS. 3d and 4e is the same). FIGS. 3f and g show morphological characterization of spiro-OMeTAD coated perovskite film and spiro-OMeTAD based PSC. FIG. 3f: Top-view SEM micrograph of spiro-OMeTAD layer deposited onto perovskite film showing the presence of pin holes. FIG. 3g: Cross section SEM micrograph displaying the thickness of different layers of the complete device.

FIG. 4a, J-V curve of the spiro-OMeTAD based device recorded at a scan rate of 0.01 V/s; the inset shows the $V_{OC}$ as a function of illumination intensity with an ideality factor of 1.46. FIG. 4b, J-V curve of the CuSCN based device recorded at a scan rate of 0.01 V/s; the inset shows the $V_{OC}$ as a function of illumination intensity with an ideality factor of 1.51. FIG. 4c, J-V metrics for 20 independent devices based on spiro-OMeTAD and CuSCN. FIG. 4d, The maximum power point (MPP) tracking for 60 s yielding a stabilized efficiency of 20.5 and 20.3%, respectively, for spiro-OMeTAD and CuSCN based devices. FIG. 4e, EQE as a function of monochromatic wavelength recorded for spiro-OMeTAD and CuSCN based devices and the integrated current densities obtained from the respective EQE spectra. FIG. 4f, Operational stability of un-encapsulated CuSCN based device (PCE=20.03%, see FIG. 5) containing a thin layer of rGO (as a spacer layer between perovskite and gold layers), examined at a maximum-power-point under continuous full-sun illumination at 60° C. in nitrogen atmosphere.

FIG. 10a: Light intensity dependence of $J_{SC}$ in spiro-OMeTAD based device (Black solid squares) red color solid line: linear fit. FIG. 10b: Light intensity dependence of $J_{SC}$ in CuSCN based device (Blue solid squares) red color solid line: linear fit FIG. 11a: J-V characteristics of the best devices obtained after employing concentration of 15, 25, and 45 mg/mL of CuSCN in diethyl sulfide recorded at a scan rate of 0.05 V/s (reverse scans). (Inset shows the photovoltaic parameters extracted from the JV curves). FIG. 11b: J-V curves of the best CuSCN based device involving conventional deposition of CuSCN recorded at a scan rate of 0.05V/s. (Inset shows the photovoltaic parameters extracted from the JV curve).

DETAILED DESCRIPTION OF THE PREFERRED EMBODIMENTS

Figure 1:
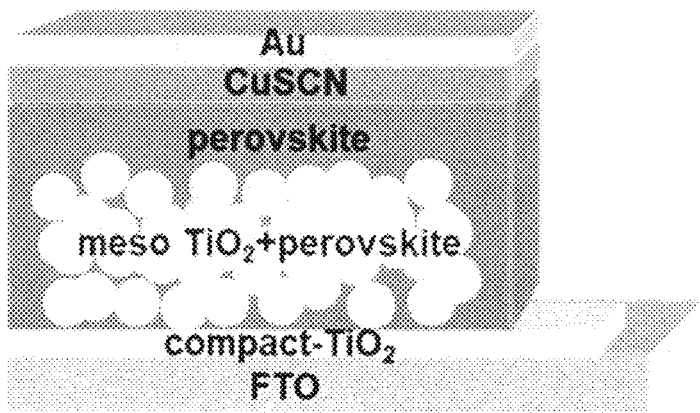
FIG. 1 shows a schema of a solid state solar cell with a conventional architecture comprising, from the bottom to the top.
Figure 1:
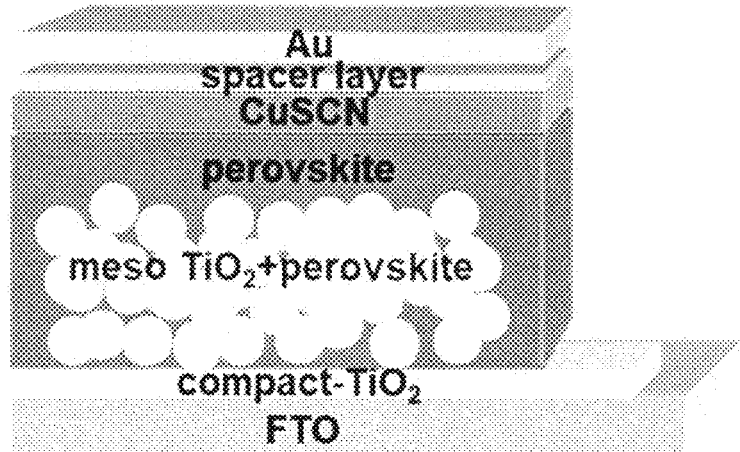

The present invention provides an optoelectronic and/or photovoltaic or photoelectrochemical device comprising a conductive support layer, n-type semiconductor, a sensitizer or light-absorber layer, a hole transporting layer, a spacer layer and a back contact, wherein the n-type semiconductor is in contact with the sensitizer or light-absorber layer, the sensitizer or light-absorber layer comprises an organic-inorganic perovskite or metal halide perovskite material, the hole transporting layer is in direct or indirect contact with the sensitizer or light-absorber layer and comprises an inorganic hole transporting material or inorganic p-type semiconductor, the spacer layer is between the hole transporting layer and the back contact or between the sensitizer or light-absorber layer and the hole transporting layer and comprises a material being different from the inorganic hole transporting material and the material of the back contact as shown in FIG. 1.

The optoelectronic and/or photovoltaic or photoelectrochemical device of the invention is selected from a photovoltaic device, preferably a solid state solar cell. Said photovoltaic device is selected from an organic solar cell, a solid state solar cell, from a p-n heterojunction, a phototransistor or OLED (organic light-emitting diode), preferably from a solar cell or a solid state solar cell.

The spacer layer comprises a material, conducting or non-conducting material, which prevents a reaction preferably between the hole transporting material or hole conductor and the back contact under stress, e.g., thermal stress or under illumination. It may also prevent a reaction between the light-absorber layer and the hole transporting layer, if the spacer layer is present between these two layers.

In one embodiment, the spacer layer comprises a material selected from reduced graphene oxide (rGO), graphene oxide, graphene, Ni, Co, Cr, $Al_2O_3$, Cu, C (carbon), $ZrO_2$, $SiO_2$, SiC, $Si_3N_4$, $Ca_3(PO_4)_2$, insulating polymers selected from PMMA (polymethyl methacrylate), polycarbonate polymers, and boron nitride (BN). Preferably the spacer layer comprises a material selected from reduced graphene oxide, Cr and $Al_2O_3$.

In one embodiment, it is not excluded that the spacer layer may comprise metal oxide material selected from Mg-oxide, Hf-oxide, Ga-oxide, In-oxide, Nb-oxide, Ti-oxide, Ta-oxide, Y-oxide and Zr-oxide.

The thickness of said spacer layer depends on the electrical properties but is usually from less 1 nm to 5 nm, e.g. in case of insulating material, or from 10 nm to 20 m, e.g., in case of conducting or semi-conducting layers. The thickness of the spacer layer is in the range from less 1 nm to 20 nm, from 5 nm to 15 nm, from 8 nm to 10 nm, from 2 nm to 5 nm. The spacer layer is preferably between the hole transporting layer and the back contact.

In a further embodiment the n-type semiconductor comprises a metal oxide layer. In particular, the n-type semiconductor comprises a metal oxide layer being a compact layer onto which a mesoporous metal oxide layer being a surface-increasing scaffold structure for the organic-inorganic perovskite or metal halide perovskite material is provided. The n-type semiconductor comprises metal oxide particles selected from Si, $TiO_3$, $SnO_2$, ZnO, $Zn_2SnO_4$, $Nb_2O_5$, $WO_3$, $BaTiO_3$ or $SrTiO_3$ or any combination thereof.

The n-type semiconductor as electron transport layer is an inorganic material. Said n-type semiconductor can be mesoporous and made of semiconductor particles. Preferably, the semiconductor particles are selected from $TiO_2$ and ZnO, most preferably $TiO_2$. The thickness of the n-type semiconductor layer is in the range from 50 nm to 1000 nm, preferably from 50 to 600 nm.

By "hole transport material", "hole transporting material", "organic hole transport material" and "inorganic hole transport material", and the like, is meant any material or composition wherein charges are transported by electron or hole movement (electronic motion) across said material or composition. The "hole transport material" is thus an electrically conductive material. Such hole transport materials, etc., are different from electrolytes. In this latter, charges are transported by diffusion of molecules.

In a further embodiment, the hole transporting layer comprises one or more inorganic hole transporting materials or inorganic p-type semiconductors selected from NiO, CuO, CuSCN, CuI, CuGaO$_2$, CuCrO$_2$, CuAlO$_2$, CsSnI$_3$, MoO$_3$ or WO$_3$ or any combination thereof. Preferably, the semiconductor particles are selected from NiO, CuO, CuSCN, CuI. The thickness of the p-type semiconductor layer is in the range from 40 nm to 1000 nm, from 40 to 200 nm, from 40 to 70 nm, from 40 to 60 nm. Preferably the hole transporting layer comprises a film free of pinholes and having a thickness from 40 to 70 nm. The hole transporting layer is under the form of a thin film free of pinholes and uniform, i.e. comprising one type of conformal structure or monotypism (only one type of layer stacking order) of the hole transporting material. Such a type of film is provided by dynamic deposition method of the hole transporting material in solution on the perovskite or sensitizer or light-absorber layer or, if present the spacer layer, said method comprising a drop-casting step with spinning of the hole transporting material in solution, namely dissolved in a solvent selected from diethyl sulfide, propyl sulfide, or a mixture of diethyl and propyl sulfide and drop-casted in a short time period (2-3 seconds) with a spinning at 5000 rpm. Said hole transporting layer is preferably free of p-dopant or other organic hole transporting material.

The deposition of the inorganic p-type semiconductor is not limited to the dynamic deposition. It may also include different methods, such as doctor blading, electrodeposition, spin coating, and spray coating. The deposition of the inorganic hole transporting material with this dynamic method, namely drop-casting with spinning allows to obtain very thin film without pinholes, which provides stability to a device to resist to thermal stress and aging and lead to retain about 85% of the initial PCE of the device during said thermal stress and aging treatment.

According to a further embodiment, the conductive support layer comprises a conductive material selected from indium tin oxide (ITO) film substrate, fluorine-doped tin oxide (FTO), film substrate, ZnO—Ga$_2$O$_3$ film substrate, ZnO—Al$_2$O$_3$ film substrate, tin-based oxides film substrate, antimony doped tin oxide (ATO), SrGeO$_3$ or zinc oxide. Preferably the conductive support layer comprises a transparent substrate covered by the conductive material. Specific examples of the transparent substrate include, but are not limited to, a glass substrate, transparent inorganic substrates, such as quartz and glass; transparent plastic substrates, such as poly(ethylene terephthalate) (PET), poly(ethylene 2,6-naphthalate) (PEN), polycarbonate (PC), polyethylene (PE), polypropylene (PP), and polyimide (PI). Preferably, the material of the transparent substrate is glass.

The conductive support layer preferably functions and/or comprises a current collector, collecting the current obtained from the solar cell.

The back contact generally comprises a catalytically active material, suitable to provide electrons and/or fill holes towards the inside of the device. The back contact may comprise one or more materials selected from Pt, Au, Ni, Cu, Ag, In, Ru, Pd, Rh, Ir, Os, porous carbon (C), conductive polymer and a combination of two or more of the aforementioned. Conductive polymers may be selected from polymers comprising polyaniline, polypyrrole, polythiophene, polybenzene, polyethylenedioxythiophene, polypropylenedioxy-thiophene, polyacetylene, and combinations of two or more of the aforementioned, for example.

In an embodiment, the back contact comprises a material selected from a metal selected from Pt, Au, Ni, Cu, Ag, In, Ru, Pd, Rh, Ir, or Os, from porous carbon or from conductive polymer as defined above or a combination thereof. Preferably the back contact is selected from gold (Au), silver (Ag), aluminum (Al), copper (Cu), platinum (Pt), nickel (Ni). Furthermore, the back contact is more preferably gold (Au) with a thickness of range between 50 nm and 200 nm. Additionally, said electrode may be porous Carbon (C).

The term "perovskite", for the purpose of this specification, refers to the "perovskite structure" and not specifically to the perovskite material, CaTiO$_3$. For the purpose of this specification, "perovskite" encompasses and preferably relates to any material that has the same type of crystal structure as calcium titanium oxide and of materials in which the bivalent cation is replaced by two separate monovalent cations. The perovskite structure has the general stoichiometry AMX$_3$, where "A" and "M" are cations and "X" is an anion. The "A" and "M" cations can have a variety of charges and in the original Perovskite mineral (CaTiO$_3$), the A cation is divalent and the M cation is tetravalent. For the purpose of this invention, the perovskite formulae includes structures having three or four anions, which may be the same or different, and/or one or two organic cations, and/or metal atoms carrying two or three positive charges, in accordance with the formulae presented elsewhere in this specification.

The sensitizer or light-absorber layer may comprise one or more layers of an organic-inorganic perovskite or a metal halide perovskite. In said device, the last upper layer of organic-inorganic perovskite or metal halide perovskite is coated by the hole transport material or, if present by the spacer layer. The organic-inorganic perovskite or metal halide perovskite may be provided on the mesoscopic part of the n-type semiconductor on the metal oxide layer.

According to another embodiment, the perovskite or metal halide perovskite is selected from a perovskite structure according to any one of formulae (I), (Ia), (Ib), (Ic), (Id), (Ie), (If) and/or (Ig) below:

$$AA'MX_4 \tag{I}$$

$$AMX_3 \tag{Ia}$$

$$AA'N_{2/3}X_4 \tag{Ib}$$

$$AN_{2/3}X_3 \tag{Ic}$$

$$BN_{2/3}X_4 \tag{Id}$$

$$BMX_4 \tag{Ie}$$

$$(A_1)_m AA'MX_3 \tag{If}$$

$$(A_1)_m AMX_3 \tag{Ig}$$

wherein,

A and A' are organic, monovalent cations being independently selected from primary, secondary, tertiary or quaternary organic ammonium compounds, including N-containing heterorings and ring systems, A and A' having independently from 1 to 60 carbons and 1 to 20 heteroatoms;

$A_1$ is an inorganic cation selected from Cs$^+$, Rb$^+$, K$^+$ and m is an integer from 1 to 3, each $A_1$ if m>1 being different;

B is an organic, bivalent cation selected from primary, secondary, tertiary or quaternary organic ammonium compounds having from 1 to 60 carbons and 2-20 heteroatoms and having two positively charged nitrogen atoms;

M is selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, $Yb^{2+}$, $[Sn_jPb_{(1-i)}]$, $[Sn_jGe_{(1-j)}]^+$, and $[Pb_kGe_{(1-k)}]^+$, i, j and k being a number between 0.0 and 1.0;

N is selected from the group of $Bi^{3+}$ and $Sb^{3+}$; and,

X are independently selected from $Cl^-$, $Br^-$, $I^-$, $NCS^-$, $CN^-$, $NCO^-$, from $[I_{(3-m)}Cl_m]^-$, $[I_{(3-n)}Br_n]^-$, $[Br_{(3-u)}Cl_u]^-$, m, n u being a number between 0.0 and 3.0, and from a combination of two anions selected from $Cl^-$, $Br^-$, $I^-$.

In particular, the three or four X may be identical or different. For example, in $AMX_3$ (formula Ia) may be expressed as formula (Ia') below:

$$AMXiXiiXiii \qquad (Ia')$$

wherein Xi, Xii, Xiii are independently selected from $Cl^-$, $Br^-$, $I^-$, $NCS^-$, $CN^-$, $NCO^-$, from $[I_{(3-m)}Cl_m]^-$, $[I_{(3-n)}Br_n]^-$, $[Br_{(3-u)}Cl_u]^-$, m, n u being a number between 0.0 and 3.0, and from a combination of two anion selected from $Cl^-$, $Br^-$, $I^-$, preferably from halide ($Cl^-$, $Br^-$, $I^-$) and A and M are as defined elsewhere in this specification. Xi, Xii, Xiii may thus be the same or different in this case.

Preferably, if Xi, Xii, Xiii in formulae (Ia) and (Ic) or Xi, Xii, Xiii, Xiv in formulae (I), (Ib), (Id) or (Ie) comprise different anions X, there are not more than two different anions. For example, Xi and Xii being the same with Xiii being an anion that is different from Xi and Xii.

According to perovskite-structure of formula (If) or (Ig), A and A' are independently selected from methylammonium cation, formamidinium cations, iodo-carbamimidoyl cation or a combination of said cations.

According to a preferred embodiment, said perovskite or metal halide perovskite layer comprises a perovskite-structure according to any one of the formulae (Ih) to (Im):

$$APbX_3 \qquad (Ih)$$

$$ASnX_3 \qquad (Ii)$$

$$ABiX_4 \qquad (Ij)$$

$$AA'PbX_4 \qquad (Ik)$$

$$AA'SnX_4 \qquad (IIj)$$

$$BPbX_4 \qquad (Il)$$

$$BSnX_4 \qquad (Im)$$

wherein A, A', B and X are as defined above in this specification. Preferably, X is preferably selected from $Cl^-$, $Br^-$ and $I^-$, most preferably X is $I^-$ or a mixture of $Br^-$ and $I^-$.

The sensitizer or light-absorber layer comprising organic-inorganic perovskite or metal halide perovskite may comprise a perovskite-structure according to any of the formulae (If) to (Im), more preferably (If) (Ih) and/or (Ii).

According to an embodiment, A and A' are monovalent cations selected independently from any one of the compounds of formulae (20) to (28) below:

(20)

(21)

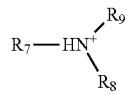
(22)

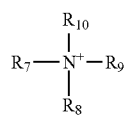
(23)

(24)

(25)

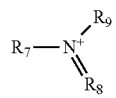
(26)

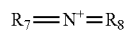
(27)

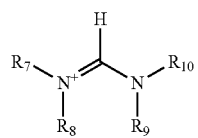
(28)

wherein, $R_7$, $R_8$, $R_9$ and $R_{10}$ is independently selected from C1-C15 organic substituents comprising from 0 to 15 heteroatoms.

According to an embodiment of said C1-C15 organic substituent any one, several or all hydrogens in said substituent may be replaced by halogen and said organic substituent may comprise up to fifteen (15) N, S or O heteroatoms, and wherein, in any one of the compounds (20) to (28), the two or more of substituents present ($R_7$, $R_8$, $R_9$ and $R_{10}$, as applicable) may be covalently connected to each other to form a substituted or unsubstituted ring or ring system. Preferably, in a chain of atoms of said C1-C15 organic substituent, any heteroatom is connected to at least one carbon atom. Preferably, neighboring heteroatoms are absent and/or heteroatom-heteroatom bonds are absent in said C1-C15 organic substituent comprising from 0 to 15 heteroatoms. The heteroatoms may be selected from N, S, and/or O.

According to an embodiment, $R_7$, $R_8$, $R_9$ and $R_{10}$ are independently selected from C1 to C15 aliphatic and C4 to C15 aromatic or heteroaromatic substituents, wherein any one, several or all hydrogens in said substituent may be replaced by halogen and wherein, in any one of the compounds (20) to (28), the two or more of the substituents present may be covalently connected to each other to form a substituted or unsubstituted ring or ring system.

According to a preferred embodiment, the organic-inorganic perovskite is selected from a compound of formula (I), (Ia), (If) or (Ig).

According to an embodiment, B is a bivalent cation selected from any one of the compounds of formulae (49) and (50) below:

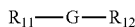

(29)

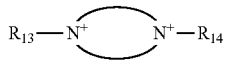

(30)

wherein,
in the compound of formula (29), G is an organic linker structure having 1 to 10 carbons and 0 to 5 heteroatoms selected from N, S, and/or O, wherein one or more hydrogen atoms in said G may be replaced by halogen;
wherein $R_{11}$ and $R_{12}$ are independently selected from a compounds of any one of formulae (20) to (28); and wherein, in the compound of formula (30), the circle containing said two positively charged nitrogen atoms represents a substituted or unsubstituted aromatic ring or ring system comprising 4 to 15 carbon atoms and 2 to 7 heteroatoms or 4 to 10 carbon atoms and 2 to 5 heteroatoms, wherein said nitrogen atoms are ring heteroatoms of said ring or ring system, and wherein the remaining of said heteroatoms may be selected independently from N, O and S and wherein $R_{13}$ and $R_{14}$ are independently selected from H and from a compounds of any one of formulae (20) to (28). Halogen atom substituting hydrogen atom totally or partially may also be present in addition to and/or independently of said 2 to 7 heteroatoms.

Preferably, if the number of carbons is in G is impair, the number of heteroatoms is smaller than the number of carbons. Preferably, in the ring structure of formula (30), the number of ring heteroatoms is smaller than the number of carbon atoms. According to an embodiment, G is an aliphatic, aromatic or heteroaromatic linker structure having from 1 to 10 carbons.

According to an embodiment, $R_7$, $R_8$, $R_9$ and $R_{10}$ are independently selected from C1 to C10 alkyl, C2 to C10 alkenyl, C2 to C10 alkynyl, C4 to C10 heteroaryl and C6 to C10 aryl, wherein said alkyl, alkenyl, and alkynyl, if they comprise 3 or more carbons, may be linear, branched or cyclic, wherein said heteroaryl and aryl may be substituted or unsubstituted, and wherein several or all hydrogens in $R_7$, $R_8$, $R_9$ and $R_{10}$ may be replaced by halogen.

According to an embodiment, $R_7$, $R_8$, $R_9$ and $R_{10}$ are independently selected from C1 to C8 alkyl, C2 to C8 alkenyl, C2 to C8 alkynyl, C4 to C8 heteroaryl and C6 to C8 aryl, wherein said alkyl, alkenyl, and alkynyl, if they comprise 3 or more carbons, may be linear, branched or cyclic, wherein said heteroaryl and aryl may be substituted or unsubstituted, and wherein several or all hydrogens in $R_7$, $R_8$, $R_9$ and $R_{10}$ may be replaced by halogen.

According to an embodiment, $R_7$, $R_8$, $R_9$ and $R_{10}$ are independently selected from C1 to C6 alkyl, C2 to C6 alkenyl, C2 to C6 alkynyl, C4 to C6 heteroaryl and C6 aryl, wherein said alkyl, alkenyl, and alkynyl, if they comprise 3 or more carbons, may be linear, branched or cyclic, wherein said heteroaryl and aryl may be substituted or unsubstituted, and wherein several or all hydrogens in $R_7$, $R_8$, $R_9$ and $R_{10}$ may be replaced by halogen.

According to an embodiment, $R_7$, $R_8$, $R_9$ and $R_{10}$ are independently selected from C1 to C4 alkyl, C2 to C4 alkenyl and C2 to C4 alkynyl, wherein said alkyl, alkenyl and alkynyl, if they comprise 3 or more carbons, may be linear, branched or cyclic, and wherein several or all hydrogens in $R_7$, $R_8$, $R_9$ and $R_{10}$ may be replaced by halogen.

According to an embodiment, $R_7$, $R_8$, $R_9$ and $R_{10}$ are independently selected from C1 to C3, preferably C1 to C2 alkyl, C2 to C3, preferably C2 alkenyl and C2 to C3, preferably C2 alkynyl, wherein said alkyl, alkenyl and alkynyl, if they comprise 3 or more carbons, may be linear, branched or cyclic, and wherein several or all hydrogens in $R_7$, $R_8$, $R_9$ and $R_{10}$ may be replaced by halogen.

According to an embodiment, $R_7$, $R_8$, $R_9$ and $R_{10}$ is independently selected from C1 to C4, more preferably C1 to C3 and even more preferably C1 to C2 alkyl. Most preferably $R_7$, $R_8$, $R_9$ and $R_{10}$ are methyl. Again, said alkyl may be completely or partially halogenated.

According to an embodiment, A, A' and B are monovalent (A, A') and bivalent (B) cations, respectively, selected from substituted and unsubstituted C5 to C6 rings comprising one, two or more nitrogen heteroatoms, wherein one (for A and A) or two (for B) of said nitrogen atoms is/are positively charged. Substituents of such rings may be selected from halogen and from C1 to C4 alkyls, C2 to C4 alkenyls and C2 to C4 alkynyls as defined above, preferably from C1 to C3 alkyls, C3 alkenyls and C3 alkynyls as defined above. Said ring may comprise further heteroatoms, which may be selected from O, N and S. Bivalent organic cations B comprising two positively charged ring N-atoms are exemplified, for example, by the compound of formula (30) above. Such rings may be aromatic or aliphatic.

A, A' and B may also comprise a ring system comprising two or more rings, at least one of which being from substituted and unsubstituted C5 to C6 ring as defined as above. The elliptically drawn circle in the compound of formulae (30) may also represent a ring system comprising, for example, two or more rings, but preferably two rings. Also if A and/or A' comprises two rings, further ring heteroatoms may be present, which are preferably not charged, for example.

According to an embodiment, however, the organic cations A, A' and B comprise one (for A, A'), two (for B) or more nitrogen atom(s) but are free of any O or S or any other heteroatom, with the exception of halogens, which may substitute one or more hydrogen atoms in cation A and/or B.

A and A' preferably comprise one positively charged nitrogen atom. B preferably comprises two positively charged nitrogen atoms.

A, A' and B may be selected from the exemplary rings or ring systems of formulae (31) and (32) (for A, A') and from (33) to (35) (for B) below:

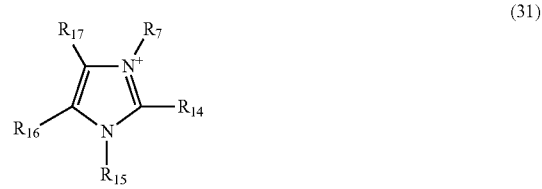

(31)

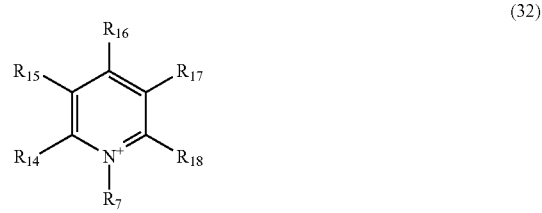

(32)

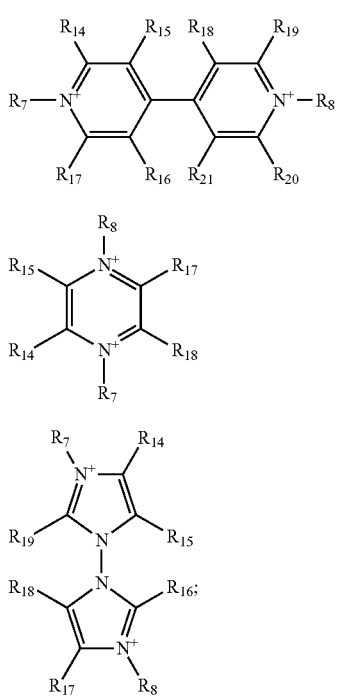

(33)

(34)

(35)

wherein
R$_7$ and R$_8$ are selected from substituents as defined above, and R$_{14}$, R$_{15}$, R$_{16}$, R$_{17}$, R$_{18}$, R$_{19}$, R$_{20}$ and R$_{21}$ are independently selected from H, halogen and substituents as defined above for R$_7$, R$_8$, R$_9$ and R$_{10}$. Preferably, R$_{14}$, R$_{15}$, R$_{16}$, R$_{17}$, R$_{18}$, R$_{19}$, R$_{20}$ and R$_{21}$ are selected from H and halogen, most preferably H.

In the organic cations A, A' and B, hydrogen atoms may be substituted by halogens, such as F, Cl, I, and Br, preferably F or Cl. Such a substitution is expected to reduce the hygroscopic properties of the perovskite layer or layers and may thus provide a useful option for the purpose of the present specification.

According to a preferred embodiment, A and A' are independently selected from organic cations of formula (20) and/or formula (28).

According to a preferred embodiment, the metal M is selected from Sn$^{2+}$ and Pb$^{2+}$, preferably Pb$^{2+}$. According to a preferred embodiment, N is Sb$^{3+}$.

According to a preferred embodiment, the three or four X are independently selected from Cl$^-$, Br$^-$, and I$^-$.

In a further aspect, the present invention provides a method for manufacturing a solid state solar cell or an optoelectronic and/or photovoltaic or photoelectrochemical device comprising:
providing a conductive support layer,
providing a n-type semiconductor onto the conductive support layer,
providing a sensitizer or light-absorber layer onto the n-type semiconductor,
providing a hole transporting layer onto the sensitizer or light-absorber layer followed by the application of a spacer layer; or
providing a spacer layer onto the sensitizer or light-absorber layer followed by the application of a hole transporting layer,
providing a counter or back contact electrode on the hole transporting layer or on the spacer layer.

According to one embodiment, the provided hole transporting layer comprises an inorganic hole transporting material or inorganic p-type semiconductor as above-defined and is deposited by dynamic deposition method onto the sensitizer or light-absorber layer, said dynamic deposition method comprising depositing the inorganic hole transporting material or inorganic p-type semiconductor in solution onto the sensitizer or light-absorber layer by a method selected from drop-casting, doctor blading, electrodeposition, spin coating, or spray coating, while spinning the conductive support layer supporting the n-type semiconductor and the sensitizer or light-absorber layer. Preferably, the application of the inorganic hole transporting material while spinning the conductive support supporting the layers under the hole transporting layer is provided by spin-coating.

According to an embodiment, the step of providing a hole transporting layer comprising applying the hole transporting material by drop-casting said hole transporting material in solution onto the sensitizer or light-absorber layer or, if present, the spacer layer, and a step of spinning. The step of spinning is performed at a rotational speed from 4000 to 6000 rpm, from 4500 to 5500 rpm, preferably 5000 rpm or from 66.67 Hz to 100 Hz, 75 Hz to 91.67 Hz, preferably 83.34 Hz. The hole transporting material is inorganic hole transporting material as defined above.

The present invention is described more concretely with reference to the following examples, which, however, are not intended to restrict the scope of the invention.

EXAMPLES

Example 1: Preparation of Organic-Inorganic Perovskite Based Devices

Preparation of TiO$_2$ Photoanode.

Fluorine-doped tin oxide (FTO)-glass substrates (TCO glass, NSG 10, Nippon sheet glass, Japan) were cleaned by ultrasonication in Hellmanex (2%, deionized water) for 30 min, rinsed thoroughly with de-ionized water and ethanol, and then treated in oxygen plasma for 15 min. A compact layer of TiO$_2$ of ca 30 nm was subsequently deposited via spray pyrolysis at 450° C. from a precursor solution of commercial titanium diisopropoxide bis(acetylacetonate) (75% in 2-propanol, Sigma-Aldrich) diluted in anhydrous ethanol (1:9, volume ratio) and oxygen as a carrier gas. A mesoporous TiO$_2$ layer was then deposited by spin coating a diluted paste at a spin speed of 4000 rpm, acceleration 2000 rpm for 20 s (the weight ratio of TiO$_2$ (Dyesol paste, 30NRD) and ethanol is 1:6), onto the substrate containing TiO$_2$ compact layer. This was followed by sintering the substrates at 450° C. for 30 min in dry air flow. For Li treatment of the mesoporous TiO$_2$ scaffold, 150 μL of LiTFSI (bis(trifluoromethylsulfonyl)imide lithium salt) solution in acetonitrile (10 mg/mL, freshly prepared in argon atmosphere) was spin coated (3000 rpm, acceleration 2000 rpm for 20 s) after a loading time of 10 s. Thereafter, Li-treated substrates were subjected to a second sintering step at 450° C. for 30 min in dry air. The substrates were transferred in a dry air glove box (humidity<1%) after cooling down to 200° C. for perovskite deposition.

Preparation Perovskite.

The perovskite films were deposited using single-step deposition method from the precursor solution containing FAI (1.0 M) (Dyesol), PbI$_2$ (1.1 M) (TCI), MABr (0.2 M) (Dyesol) and PbBr$_2$ (0.2 M) (TCI) in anhydrous dimethylformamide (99.8%, Acros)/dimethylsulphoxide (99.7%, Acros) (4:1 (v:v)). Thereafter, CsI (aber, GmbH, ultra dry;

99.998%), (5% volume, 1.5 M DMSO) was added to the precursor solution. The precursor solution was spin-coated onto the mesoporous $TiO_2$ films in a two-step programme at 1000 and 6000 rpm, for 10 and 30 s, respectively. During the second step, 100 µl of chlorobenzene (99.8%, Acros) was dropped on the spinning substrate 10 s prior to the end of the programme. This was followed by annealing the films at 100° C. for 45 min. The perovskite deposition was carried out in a dry air glove box under controlled atmospheric conditions with humidity<1%.

Deposition of Hole Transporting Layer.

To complete the fabrication of devices, 2,2',7,7'-tetrakis (N,N-di-p-methoxyphenylamine)-9,9-spirobifluorene (spiro-OMeTAD, 70 mM in chlorobenzene) as a hole-transporting material (HTM) was deposited by spin coating 40 µL of the prepared solution at 4000 rpm for 30 s. The spiro-OMeTAD (Merck) was doped with bis(trifluoromethylsulfonyl)imide lithium salt, tris(2-(1H-pyrazol-1-yl)-4-tert-butylpyridine)-cobalt(III) tris(bis(trifluoromethylsulfonyl) imide) (FK 209, from Dyenamo) and 4-tert-Butylpyridine (96%, Sigma-Aldrich) in a molar ratio of 0.5, 0.03 and 3.3, respectively. CuSCN solution was prepared by dissolving CuSCN salt (99%, Sigma-Aldrich) in 1 mL of diethyl sulfide (98%, Sigma-Aldrich) after constant stirring at room temperature for 30 min. To deposit a thin and uniform film of CuSCN, 35 µL of a CuSCN solution were drop casted within 2-3 seconds on the substrate containing perovskite film spinning at 5000 rpm, and the substrate was allowed to spin for 30 seconds. Like in case of spiro-OMeTAD deposition, no post heat treatment was applied. The deposition of hole transporting layer was carried out in a dry air glove box with humidity<1%. Finally, device fabrication was completed by thermally evaporating~60 nm of gold layer as a back contact.

Deposition of $Al_2O_3$ Spacer Layer.

$Al_2O_3$ was deposited from trimethylaluminium ($Al(CH_3)_3$) (Sigma Aldrich) and deionized $H_2O$ using Savannah ALD system from Cambridge Nanotech, USA. The precursors were pulsed into the reactor using $N_2$ (99.999%) as an inert carrier gas. The water was pulsed for 0.015 s and confined in the reactor for 60 s followed by purging of TMA for 0.015 s, and wait another 60 s, 20 ALD cycles were applied to achieve the thickness of ~2 nm.

Deposition of rGO Spacer Layer.

A thin layer (~10 nm thickness) of reduced graphene oxide (Ossila) was deposited by spin coating the solution (filtered) containing reduced graphene oxide (1 mg/mL in chlorobenzene, sonicated for 30 min) at 3000 rpm onto the CuSCN layer.

Example 2: Measurements of Photovoltaic Properties and Stability of Perovskites Based Devices Structural Characterization.

X-ray scattering experiments were done at beamline ID10 EH1 of the ESRF with a photon energy of 22 keV under nitrogen atmosphere. The beam size was 10 µm in vertical direction and 120 µm in horizontal direction. GIXD data was measured under an angle of incidence of 0.08° with a point detector. GIWAXS data was measured with a PILATUS 300 k area detector under the same angle of incidence. Calculation of powder diffraction data was done with mercury.

Morphological Characterization.

A field-emission scanning electron microscope (Merlin) was used to examine the morphology of the perovskite films and the thickness of various layers. An electron beam accelerated to 3 kV was used with an in-lens detector.

X-Ray Photoelectron Spectroscopy.

X-ray photoelectron spectroscopy (XPS) was performed on an X-ray photoelectron spectrometer (ESCALAB 250Xi, Thermo Fisher SCIENTIFIC INC., USA) with Al Kα radiation (hυ=1486.6 eV) as the source.

Charge Extraction by Linearly Increasing Voltage

Fully assembled devices were connected to a function generator and measured with an oscilloscope across a small load resistance to minimize the RC effects of the circuit. The mobilities were measured across a range of electric fields, which are determined by the field at the time where the maximum current is extracted.

Photoluminescence Studies

Photoluminescence and time-resolved photoluminescence spectra were recorded on a spectrofluorometer Fluorolog 322. Photoluminescence spectra were recorded by exciting the samples with 450 W Xenon lamp at a fixed wavelength of 450 nm and scanning the emission monochromator from 625 to 850 nm. The same spectrometer working in a time-correlated single-photon counting mode was used for the measurements of photoluminescence decay kinetics with sub-nanosecond time resolution. Picosecond pulsed diode laser head NanoLED-405LH (Horiba) emitting<200 ps duration pulses at 408 nm with repetition rate of 1 MHz was used as an excitation source. For electron injection study, the samples were excited from the $TiO_2$ side while as to study the photoluminescence decay kinetics in pristine and HTM containing samples, the samples were excited from the top.

Photovoltaic Studies

The current-voltage (J-V) characteristics of the perovskite devices were recorded with a digital source meter (Keithley model 2400, USA). A 450 W xenon lamp (Oriel, USA) was used as the light source for photovoltaic (J-V) measurements. The light source was equipped with a Schott K113 Tempax sunlight filter (Praezisions Glas and Optik GmbH) to match the emission spectrum of the lamp to the AM1.5G standard. Before each measurement, the exact light intensity was determined using a calibrated Si reference diode equipped with an infrared cutoff filter (KG-3, Schott) The photo-active area of 0.16 $cm^2$ was defined using a dark-colored metal mask. External quantum efficiency (EQE) measurements were made using a LED light source (Ariadne EQE from Cicci Research).

Stability Test

Photo-stability tests were carried out at a maximum power point under one-sun illumination at 60° C. using a home-built electronic board with an eight-channel maximum power point capability. The channels were equipped with DACs (DAC7563), level shifters (INA2132), and an output line driver (OPA2192). The driving line had a 12 bit resolution in the ±2.048 V range (1 mV per bit). The buffer output was connected to the cells through a 0.5 Ohm sense resistor. The voltage drop was amplified (INA188) to sense the current. The voltage was buffered (OPA2188) to sense the voltage. The signal lines were multiplexed (CD54HC4051) into a fourth order active Butterworth filter with its pole set at 500 Hz. Data conversion was performed at 430 SPS by an analog to digital converter (ADS118). The DACs and the ADC were interfaced by an Atmega328 microcontroller. The light source consisted of an array of white LEDs was powered by a constant current and no filters (UV) were used. Equivalent sun intensities were calibrated using a calibrated Si reference diode equipped with a KG-3 filter. The setup was calibrated periodically using a Keithley 2602B source-measuring unit. For thermal stability tests, CuSCN based devices were coated with a thin layer (30 nm) of PMMA (20 mg/mL in chlorobenzene) atop the gold layer. Thermal stability tests were performed by ageing the devices at 85° C. in an oven and the photovoltaic efficiency under AM1.5 simulated sun light was periodically recorded.

Figure 11:
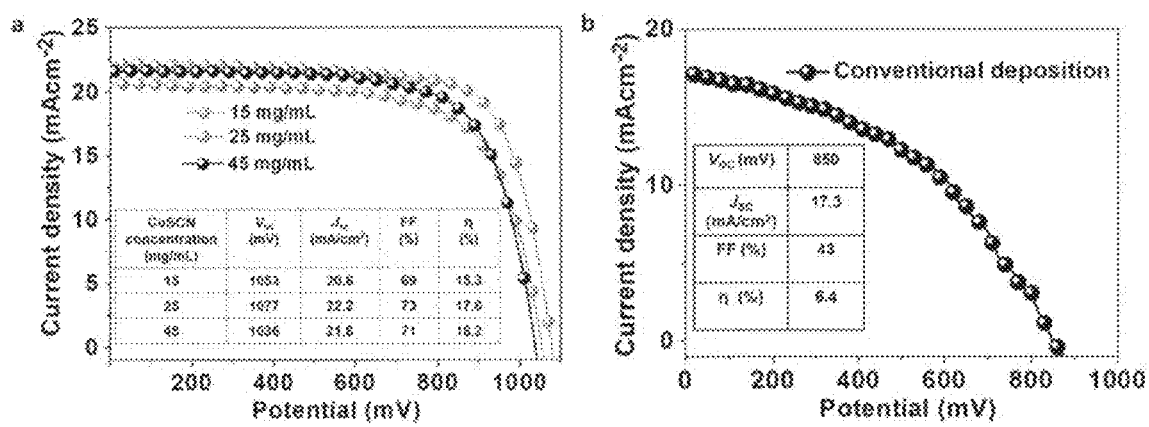
FIG. 11 shows the photovoltaic characterization.

Hole Transporting Layer: Thin Film without Pinholes Provided by Drop-Casting with Spinning The realization of efficiencies>20% using PSCs with inorganic hole transporting materials remains undoubtedly a key goal to foster the large-scale deployment of PSC. Among various inorganic hole transporting materials, CuSCN is an extremely cheap, abundant p-type semiconductor, that exhibits high hole mobility, a good thermal stability and a well-aligned work function. The CuSCN is intrinsically p-doped and transmits light across the entire visible and near infrared spectral region, so it is also attractive for tandem cell applications where the PSC is placed on top of a lower band gap semiconductor. However, the stabilized PCE values reported with CuSCN lag far behind devices based on the standard spiro-OMeTAD. For CuSCN deposition, different methods, including doctor blading, electrodeposition, spin coating, and spray coating have been tried. Of those, the solution-based bottom-up approaches are more facile; however, a critical issue associated with them is that most of the solvents in which CuSCN shows high solubility degrade the perovskite layer (FIG. 11b). Primarily, because the dearth of solvents that readily dissolve CuSCN but not the perovskites, inverted device architecture has been employed albeit with moderate success.

Figure 2:
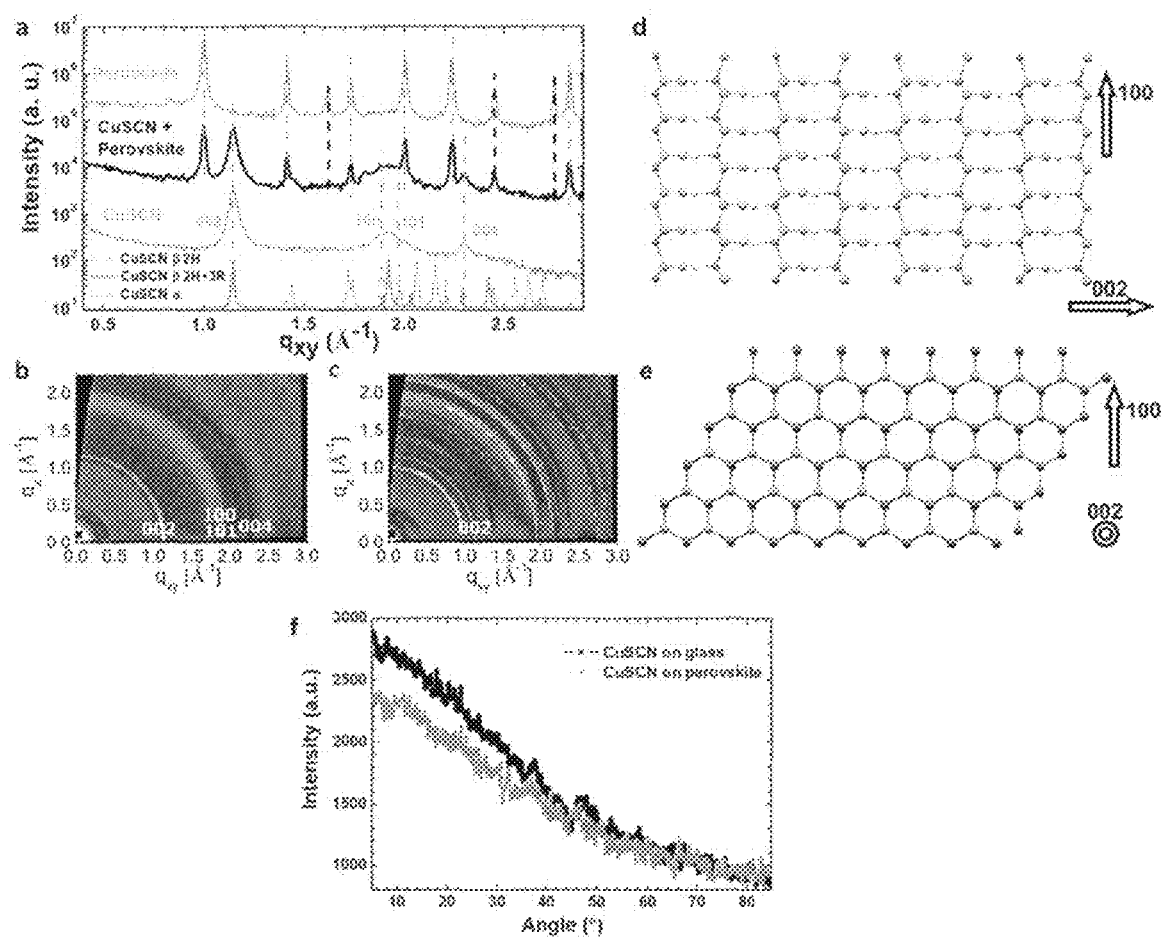
FIG. 2 shows the structural characterization of pristine, namely "pure" perovskite film not containing any CuSCN layer, and CuSCN coated perovskite films.

In order to retain the mesoscopic $TiO_2$-based normal device architecture, we develop here a simple dynamic deposition method. Typically, we deposited a thin and uniform CuSCN layer on top of $CsFAMAPbI_{3-x}Br_x$ ($MA=CH_3NH_3^+$, $FA=CH(NH_2)_2^+$) perovskite layer without compromising on the latter's quality by drop-casting a defined volume of CuSCN dissolved in diethyl sulfide in 2 to 3 s while spinning the substrate at 5000 rpm (FIG. 11a). The structural features of the resulting CuSCN layer were investigated using x-ray diffraction (XRD). CuSCN crystallizes in two polymorphs, α-CuSCN and β-CuSCN, where the latter exhibits polytypism, i.e., a variation in layer stacking order. A comparison of the calculated powder XRD spectra and grazing-incidence x-ray diffraction (GIXD) data of CuSCN (FIG. 2a) shows the dynamic deposition method yielded β-CuSCN. A broad reflection at $q=1.9$ Å$^{-1}$ established the presence of different polytypes of β-CuSCN, predominantly 2H and 3R. Coherently scattering island sizes of 17 and 18 nm were estimated using the peak width of the (002) reflection of CuSCN deposited, respectively, on the glass and perovskite film. Furthermore, to determine the domain orientation, we acquired grazing-incidence wide-angle x-ray scattering (GIWAXS) data from CuSCN and CuSCN/perovskite films (FIGS. 2b and c). From the intensity distribution of the (002) β-CuSCN ring (FIG. 2f), it is evident that the CuSCN domains have preferential orientation with the long unit cell axis parallel to the substrate (FIGS. 2d and e).

Figure 3:
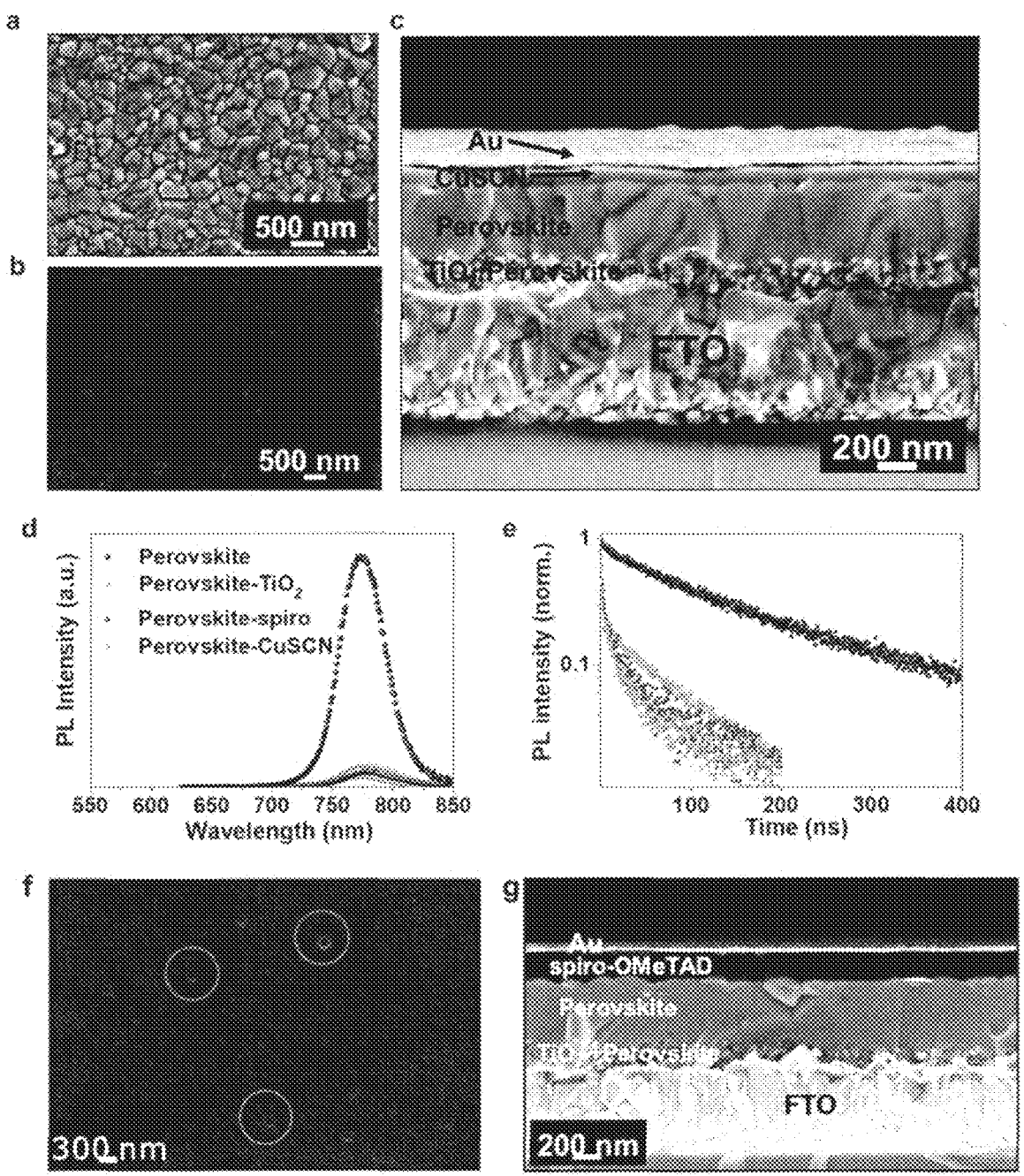
FIG. 3 shows the morphological characterization of pristine and CuSCN coated perovskite samples and steady-state and time-resolved photoluminescence studies performed on the pristine and perovskite films containing different charge extraction layers.

Scanning electron microscopy (SEM) micrographs of the perovskite film acquired before (FIG. 3a) and after (FIG. 3b) the deposition of CuSCN layer revealed the homogeneous coverage of the perovskite overlayer with the CuSCN layer. By comparison, for a spiro-OMeTAD layer deposited via the conventional spin coating method, the presence of pinholes is quite evident (FIG. 3f), which could be detrimental to performance. To evaluate the thickness of various layers, we acquired the cross-sectional SEM micrograph (FIG. 3c) of the complete device, which established the formation of ~60 nm thin CuSCN layer sandwiched between a perovskite overlayer and a gold layer. We investigated the charge-carrier dynamics in pristine and HTM-containing perovskite films using steady-state photoluminescence (PL) and time-correlated single photon counting (TCSPC) spectroscopy. The pristine perovskite film exhibited an intense PL emission centered around 773 nm with a linewidth of 44 nm (FIG. 3d). In the presence of a charge-extraction layer, the PL of the pristine perovskite film was strongly quenched, from which very rapid extraction of electrons or holes across the interfaces could be inferred. We used TCSPC spectroscopy to estimate the dynamics of charge carriers quantitatively (FIG. 3e). The long lifetime of the charge carriers ($\tau_{10}=390$ ns) is indicative of the high electronic quality of the pristine perovskite film. ($\tau_{10}$ is the time at which the initial PL intensity decreases by a factor of 10). In agreement with the steady-state PL, the charge-carrier lifetime decreased sharply in the perovskite films containing $TiO_2$ ($\tau_{10}=49$ ns) as electron extraction layer, and spiro-OMeTAD ($\tau_{10}=22$ ns) or CuSCN ($\tau_{10}=16$ ns) as hole extraction layer. In comparison, the hole injection from the valence band of perovskite into the highest occupied molecular orbital (HOMO) of HTM was more rapid than the electron injection from the conduction band of perovskite into that of $TiO_2$. In addition, TCSPC showed that the hole transfer was faster across the perovskite-CuSCN junction as compared to the perovskite-spiro-OMeTAD interface, although the thermodynamic driving force (difference between the two energy levels) is lower at the perovskite-CuSCN interface. This difference could be explained by considering that there are stronger interfacial interactions between the Pb ions of the perovskite and sulfide of CuSCN than with the organic layer.

Apart from injection, transport of charges through the HTM layer is, another critical process that strongly influences the overall device performance. In fully assembled solar cells, hole mobilities of $1.4\times10^{-6}$ cm$^2\cdot$v$^{-1}\cdot$s$^{-1}$ and $1.2\times10^{-3}$ cm$^2\cdot$v$^{-1}\cdot$s$^{-1}$ were assessed for spiro-OMeTAD and CuSCN, respectively, by using the photo-charge extraction and linearly increasing voltage. With similar charge separation and recombination dynamics in the perovskite, the ~1000 times higher hole mobility and thinner layer of CuSCN presents a distinct advantage over spiro-OMeTAD enabling the former HTM to be effective in its pristine form in contrast to the latter, which requires a high concentration of p-dopant and other additives, such as organic lithium salt and 4-tert-butylpyridine to reach its peak performance.

Figure 4:
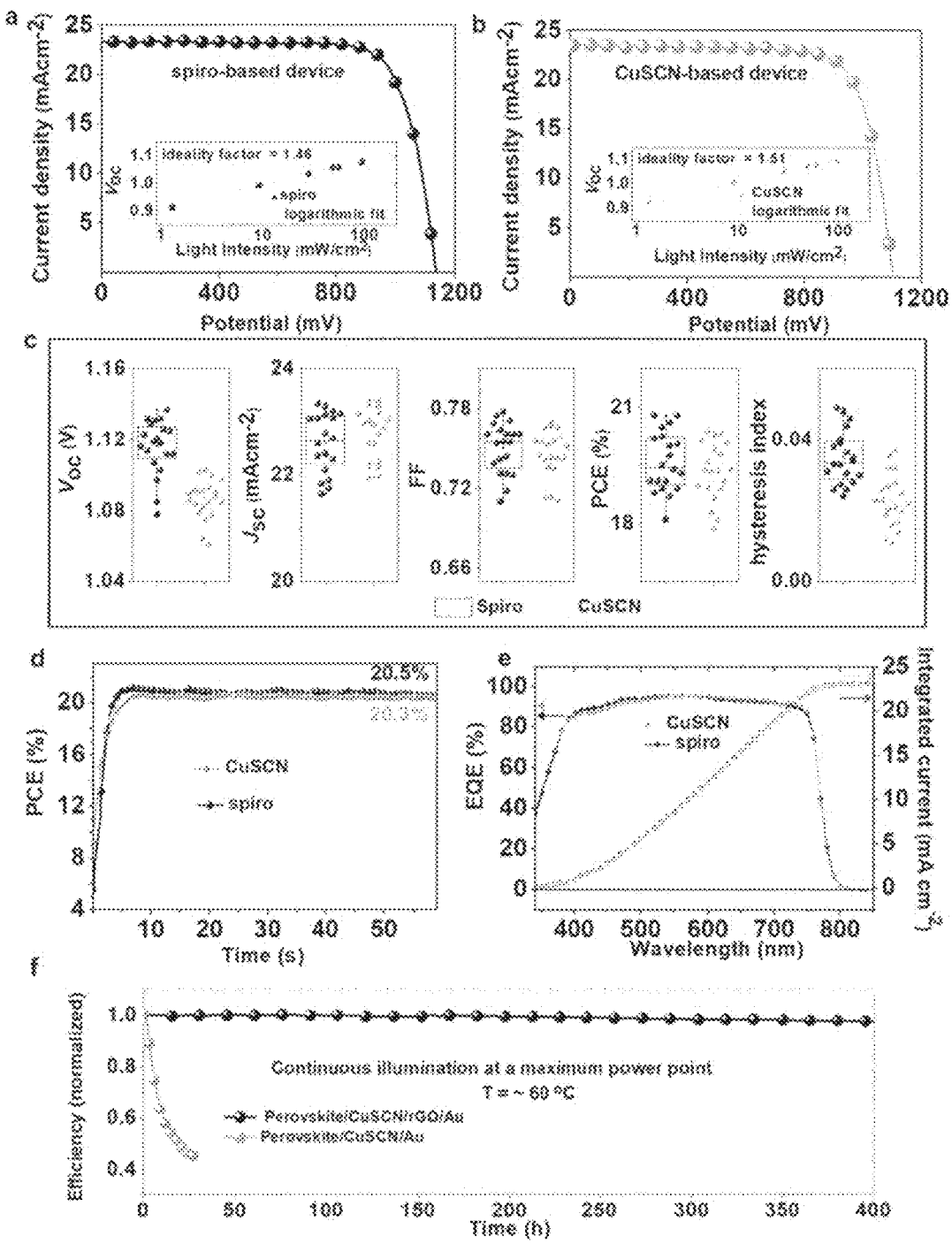
FIG. 4 shows the photovoltaic characterization of devices based on spiro-OMeTAD and CuSCN hole transporting layers.
Figure 10:
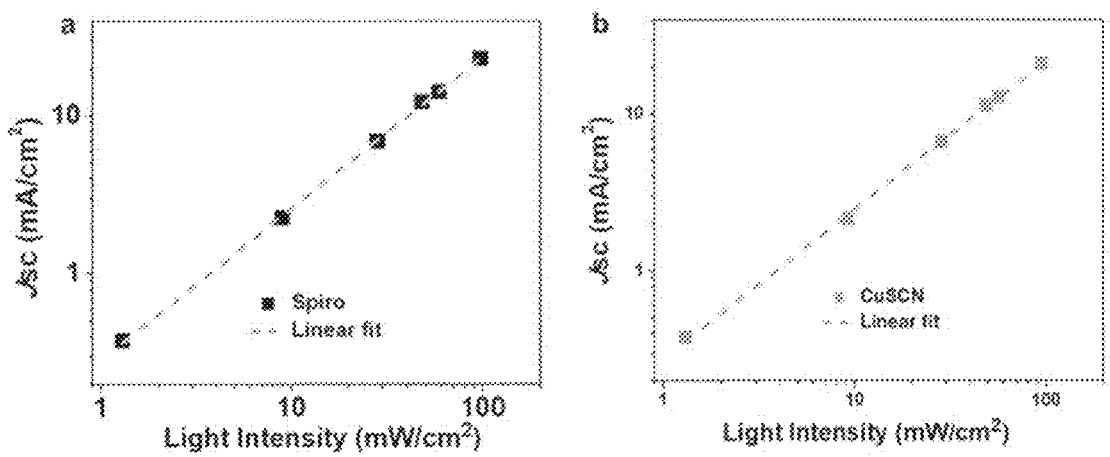
FIG. 10 shows The $J_{SC}$ (log scale) as a function of illumination intensity.

After the successful deposition of the thin and conformal β-CuSCN layer, we investigated the photovoltaic (PV) characteristics of the devices. The PV parameters extracted from the current-voltage (J-V) curve (FIG. 4a) of spiro-OMeTAD based device yielded a short-circuit current $J_{SC}$ of 23.35 mA·cm$^{-2}$, an open-circuit voltage $V_{OC}$ of 1137 mV, and a fill factor FF of 77.5% resulting in an overall efficiency of 20.8%. The device with CuSCN as HTM yielded a $J_{SC}$ of 23.40 mA·cm$^{-2}$, $V_{OC}$ of 1103 mV, and a FF of 77.2% resulting in a PCE of 20.3% (FIG. 4b). As evident from the hysteresis index values, hysteresis effect was discernable for spiro-OMeTAD by comparing the forward and backward J-V scan, but it was negligible for CuSCN (FIG. 4c). FIG. 4c shows that the $V_{OC}$ yielded by CuSCN based devices was slightly lower compared to spiro-OMeTAD based ones. To understand the cause of the $V_{OC}$ deficit in CuSCN containing devices, we estimated the ideality factor (n), which is an indicator of the dominant recombination mechanism occurring within a working device. By fitting the intensity dependence of the $V_{OC}$ curves (FIGS. 4a, 4b; insets) using the equation:

$$V_{OC} = \frac{nkT}{q} \ln\left(\frac{Jsc}{J_0}\right),$$

n of 1.46 and 1.51 were estimated, respectively, for the spiro-OMeTAD and CuSCN based devices, which indicates that the difference in the $V_{OC}$ stemmed from marginally higher monomolecular recombination occurring within the CuSCN-based devices. $J_{SC}$ as a function of illumination shows linear dependence (FIG. 10).

TABLE 1

Photovoltaic parameters from the JV curves (FIGS. 4a and 4b) of the best performing spiro-OMeTAD and CuSCN based devices measured at backward and forward scans at a scan rate of 10 mV · s$^{-1}$.

|  | Scan direction | $V_{oc}$ (mV) | $J_{sc}$ (mA/cm$^2$) | FF (%) | η (%) |
| --- | --- | --- | --- | --- | --- |
| spiro | Backward | 1137 | 23.35 | 77.5 | 20.8 |
|  | Forward | 1129 | 23.31 | 75.5 | 20.1 |
| CuSCN | Backward | 1103 | 23.40 | 77.2 | 20.3 |
|  | Forward | 1097 | 23.41 | 76.3 | 20.0 |

FIG. 4c summarizes the statistical analysis of PV parameters extracted from the J-V curves of 20 independent devices. The high PCEs were not merely reproducible for spiro-OMeTAD based PSCs but also for CuSCN ones, as we observed an average $J_{SC}$=22.77±0.49 mA·cm$^{-2}$, $V_{OC}$=1090±11 mV, and FF=0.74±0.02 resulting in an average PCE of 19.34±0.75% for CuSCN-based devices. Similarly, for the spiro-OMeTAD based devices, an average PCE of 19.6±0.77%, with an average $J_{SC}$=22.6±0.55 mA·cm$^{-2}$, $V_{OC}$=1115±15 mV, and FF=0.75±0.02 was recorded. Furthermore, to determine the stabilized (scan-speed independent) PCEs, the solar cells were probed at their maximum power point under full-sun illumination (FIG. 4d). We recorded a stabilized output power corresponding to a PCE of 20.5% and 20.3% for spiro-OMeTAD and CuSCN based devices, respectively, in close agreement with the J-V measurements. The integrated photo-current densities obtained from the external quantum efficiency (EQE) spectra of spiro-OMeTAD- and CuSCN-based devices agreed closely with those obtained from the J-V curves (FIG. 4e), indicating that any spectral mismatch between our simulator and AM-1.5 standard solar radiation was negligible.

Figure 5:
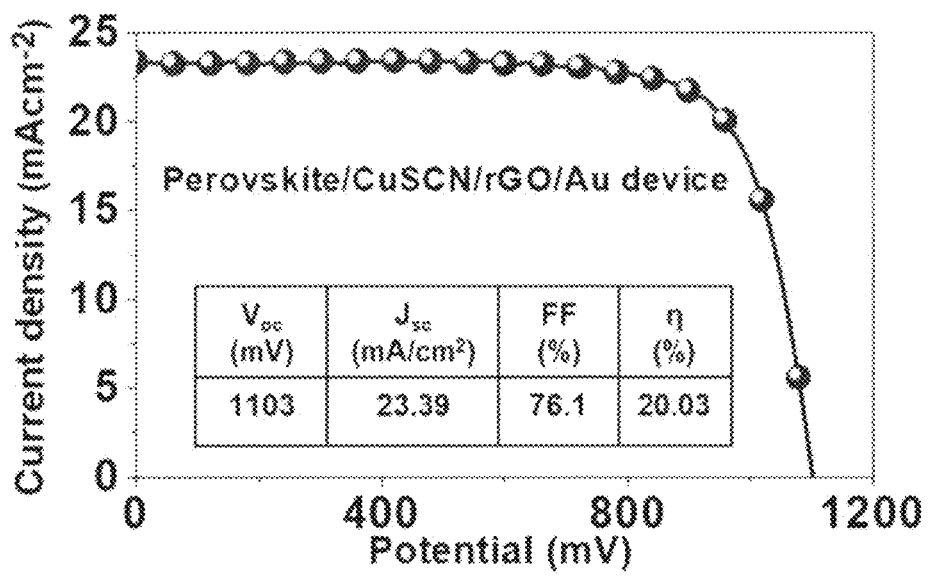
FIG. 5 shows the Photovoltaic characterization: J-V characteristic of the best CuSCN device containing a thin layer of rGO (reduced graphene oxide) as a spacer layer between perovskite and gold layers recorded at a scan rate of 10 mV/s (reverse scan).
Figure 6:
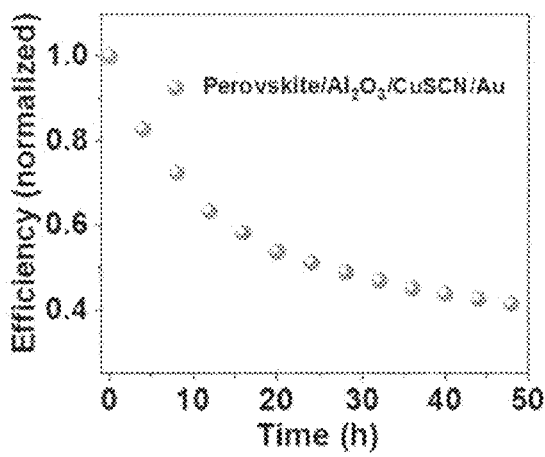
FIG. 6 shows the operational stability of CuSCN based devices with $Al_2O_3$ (20 cycles). Photo-stability examined at a maximum-power-point under continuous full-sun illumination at 60° C. in nitrogen atmosphere.
Figure 7:
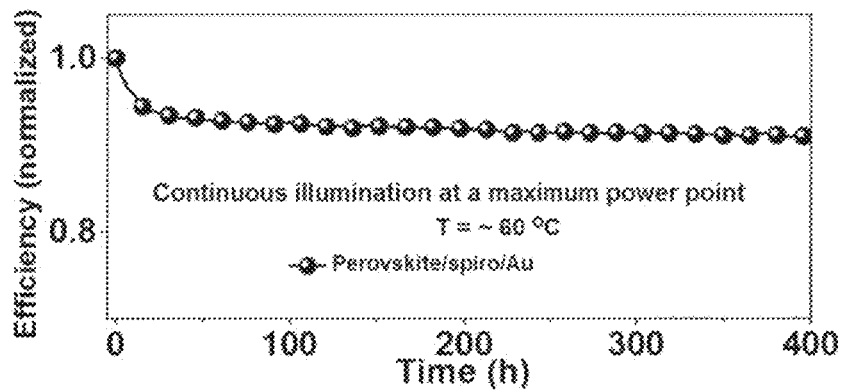
FIG. 7 shows the operational stability of un-encapsulated spiro-OMeTAD based device. Photo-stability examined at a maximum-power-point under continuous full-sun illumination at 60° C. in nitrogen atmosphere.
Figure 8:
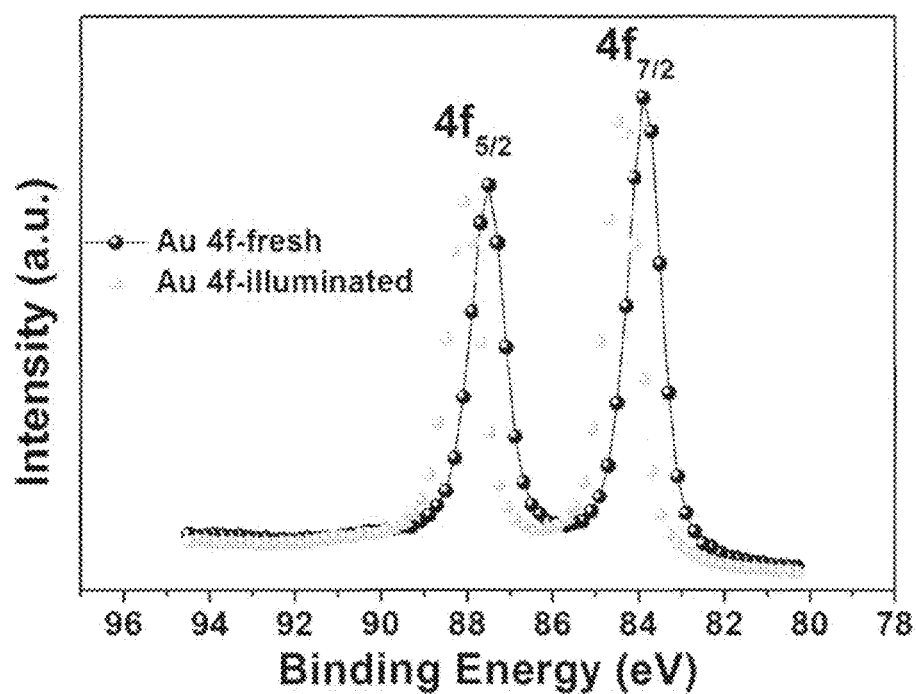
FIG. 8 shows X-ray photoelectron spectroscopy. Core shell Au 4f spectra recorded from freshly deposited gold layer and the gold layer removed from CuSCN based device illuminated at a maximum-power-point at 60° C. for 50 h
Figure 9:
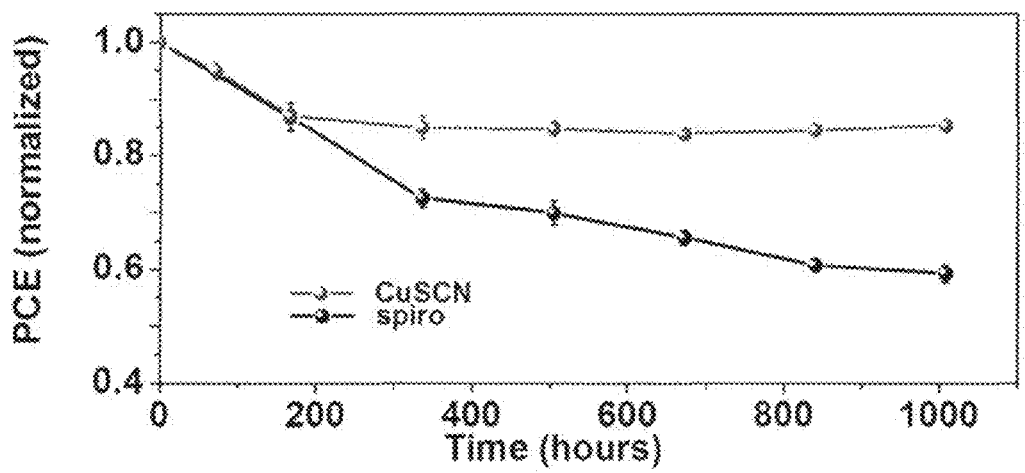
FIG. 9 shows stability test at 85° C. Thermal stability test of spiro-OMeTAD (sealed device, black curve or down curve) and CuSCN (coated with a thin layer of PMMA, blue curve or top curve) based perovskite solar cells aged at 85° C. in air for 1000 h in the dark. The error bars represent the standard deviation of a batch of four solar cells.

Long Term Stability and Introduction of Spacer Layer into Perovskite Based Devices The manifestation of the long-term operational stability is a crucial requirement for future exploitations of PSCs based technology. Under full-sun illumination at a maximum power point, the CuSCN devices showed extremely poor photo-stability losing over 50% of their initial efficiency merely within 24 h (FIG. 4f). In the literature, such instability of PSCs has been associated with the degradation of CuSCN/perovskite interface, however, deposition of ~2 nm $Al_2O_3$ layer between perovskite and CuSCN layer using ALD showed insignificant effect on the initial degradation (FIG. 6). In an unprecedented move, we introduced a thin rGO spacer layer between CuSCN and gold layers (FIG. 5), which astoundingly led to the realization of excellent operational stability under full-sun illumination at 60° C. as the resulting PSCs retained over 95% of their initial efficiency after aging for 400 h, apparently surpassing the stability of spiro-OMeTAD devices recorded under similar conditions (FIG. 7). Further insight about the degradation was gained through X-ray photoelectron spectroscopy, which establishes the oxidation of gold (FIG. 0.8) when CuSCN devices are subjected to the light soaking test. Therefore, we contend that the instability of PSCs is not associated with the degradation of CuSCN/perovskite interface as is generally believed but rather originates majorly from the CuSCN/Au contact. Furthermore, demonstrating the long-term thermal stability at high temperature has become imperative, primarily, because the diffusion of metal through spiro-OMeTAD layer at higher temperatures leads to the degradation of the devices. We examined the thermal stability of CuSCN-based devices coated with a thin layer of polymer at 85° C. in ambient conditions in the dark. After 1000 h, the CuSCN-based devices retained>85% of their initial efficiency (FIG. 9). The formation of uniform CuSCN film, as evident from morphological analysis, blocked the metal diffusion. Importantly, the CuSCN film did not require any additives to function as effective HTM in contrast to PTAA and spiro-OMeTAD, which can reach their peak performance only in the presence of LiTFSI and 4-tert-butylpyridine and, for the latter, also a Co(III) complex that acts as p-dopant. These additives readily cross into the photoactive PSC layer and adversely affect PV performance (FIG. 9). The comparative analysis of stability tests shows that the severe degradation observed under operational conditions is driven by light, and this effect is worth to investigate further.

A record performance displayed by operationally stable PSCs employing all-inorganic charge extraction layers was achieved after introducing a simple dynamic approach for the deposition of thin and conformal CuSCN layer onto perovskite layer. Importantly, we discovered that by introducing a thin rGO spacer layer between CuSCN and gold layers, excellent operational stability at a maximum power point under full-sun illumination can be realized. Such a record PCE together with a remarkable operational stability and thermal stability under long-term heat stress displayed by the PSC employing all-inorganic charge extraction layers, i.e., mesoporous $TiO_2$ and CuSCN, will foster their large scale deployment.

CONCLUSION

The prominence of organic-inorganic perovskite solar cells (PSC) can be credited to the unprecedented advancement in the power conversion efficiencies (PCEs), realized mostly by tailoring the formation and composition of the absorber layer. Certified PCEs>20% have been obtained while retaining the electron selective $TiO_2$ layer and by using either spiro-OMeTAD [2,2',7,7'-tetrakis(N,N-di-p-methoxyphenyl-amine)9,9'-spirobifluorene] or a polymer-based PTTA (poly-triarylamine) as the hole-transporting material (HTM). However, the cost of these HTMs is prohibitively high for large-scale applications and the long-term operational and thermal instability seems to be associated with the archetype organic HTMs or their ingredients. One of the strategies to combat the issues of cost and instability could be the use of inexpensive inorganic hole extraction layers similar to the use of $TiO_2$ as an electron transporting material. However, obtaining stable PCEs>20% with PSCs using inorganic HTMs, such as NiO, CuI, $Cs_2SnI_6$, and CuSCN when subjected to light soaking under realistic operational conditions, i.e., at maximum power point and elevated temperature has remained a challenge. Here we demonstrate PSCs achieving stabilized PCEs of 20.3% with CuSCN and TiO$_2$ as hole and electron extraction layer, respectively. We introduce a new method for the solution deposition of compact (60 nanometer thickness) and highly conformal CuSCN layers that afford fast carrier extraction and collection even in the absence of any dopants or additives. We show here that the notorious instability of PSCs employing CuSCN as hole conductors is not associated with the CuSCN/perovskite interface but rather originates from the CuSCN/Au contact. The introduction of a thin reduced graphene oxide (rGO) spacer layer between CuSCN and gold layers led to the realization of robust operational stability, as the PSCs retained over 95% of their initial efficiency after aging for 400 h under full-sun illumination at 60° C. In addition, CuSCN based PSCs showed excellent thermal stability under long-term heat stress, retaining over 85% of their initial efficiency after aging at 85° C. for 1000 h. Importantly, under both continuous illumination and thermal stress. CuSCN based devices surpass the stability of spiro-OMeTAD based PSCs.

Although the present invention has been explained in relation to its preferred embodiment, it is to be understood that many other possible modifications and variations can be made without departing from the scope of the invention as hereinafter claimed.

The invention claimed is:

1. An optoelectronic and/or photovoltaic or photoelectrochemical device comprising a conductive support layer, n-type semiconductor, a sensitizer or light-absorber layer, a hole transporting layer, a spacer layer and a back contact, said n-type semiconductor being in contact with the sensitizer or light-absorber layer, said sensitizer or light-absorber layer comprising a perovskite or metal halide perovskite material, said hole transporting layer being in direct contact with the sensitizer or light-absorber layer and comprising an inorganic hole transporting material or inorganic p-type semiconductor, said spacer layer being between the hole transporting layer and the back contact and preventing a reaction between the inorganic hole transporting material or inorganic p-type semiconductor and the back contact, wherein the spacer layer comprises a material being different from the inorganic hole transporting material and the material of the back contact and selected from reduced graphene oxide, graphene oxide, graphene, Ni, Co, Cr, Al$_2$O$_3$, Cu, C (carbon), ZrO$_2$, SiO$_2$, SiC, Si$_3$N$_4$, Ca$_3$(PO$_4$)$_2$, insulating polymers selected from polymethyl methacrylate (PMMA), polycarbonate polymers, and boron nitride (BN).

2. The optoelectronic and/or photovoltaic or photoelectrochemical device according to claim 1, wherein the n-type semiconductor comprises a metal oxide layer.

3. The optoelectronic and/or photovoltaic or photoelectrochemical device according to claim 1, wherein the n-type semiconductor comprises a metal oxide layer being a compact layer onto which a mesoporous metal oxide layer being a scaffold structure for the organic-inorganic perovskite or metal halide perovskite material is provided.

4. The optoelectronic and/or photovoltaic or photoelectrochemical device according to claim 1, wherein the n-type semiconductor comprises metal oxide particles selected from Si, TiO$_2$, SnO$_2$, ZnO, Zn$_2$SnO$_4$, Nb$_2$O$_5$, WO$_3$, BaTiO$_3$ or SrTiO$_3$ or any combination thereof.

5. The optoelectronic and/or photovoltaic or photoelectrochemical device according to claim 1, wherein the hole transporting layer comprises one or more inorganic hole transporting materials or inorganic p-type semiconductors selected from NiO, CuO, CuSCN, CuI CuGaO$_2$, CuCrO$_2$, CuAlO$_2$, CsSnI$_3$, MoO$_3$ or WO$_3$ or any combination thereof.

6. The optoelectronic and/or photovoltaic or photoelectrochemical device according to claim 1, wherein the hole transporting layer comprises a film free of pinholes and having a thickness from 40 to 70 nm.

7. The optoelectronic and/or photovoltaic or photoelectrochemical device according to claim 1, wherein the conductive support layer comprises a conductive material selected from indium tin oxide (ITO) film substrate, fluorine-doped tin oxide (FTO), film substrate, ZnO—Ga$_2$O$_3$ film substrate, ZnO—Al$_2$O$_3$ film substrate, tin-based oxides film substrate, antimony doped tin oxide (ATO), SrGeO$_3$ or zinc oxide.

8. The optoelectronic and/or photovoltaic or photoelectrochemical device according to claim 1, wherein the back contact comprises a material selected from a metal being selected from Pt, Au, Ni, Cu, Ag, In, Ru, Pd, Rh, Ir, or Os, from porous carbon or from conductive polymers or a combination thereof.

9. The optoelectronic and/or photovoltaic or photoelectrochemical device according to claim 1, wherein the organic-inorganic perovskite or metal halide perovskite is selected from a perovskite structures according to any one of formulae (I), (Ia), (Ib), (Ic), (Id), (Ie), (If) and/or (Ig) below:

$$AA'MX_4 \quad (I)$$

$$AMX_3 \quad (Ia)$$

$$AA'N_{2/3}X_4 \quad (Ib)$$

$$AN_{2/3}X_3 \quad (Ic)$$

$$BN_{2/3}X_4 \quad (Id)$$

$$BMX_4 \quad (Ie)$$

$$(A_1)_m AA'MX_3 \quad (If)$$

$$(A_1)_m AMX_3 \quad (Ig)$$

wherein,

A and A' are organic, monovalent cations being independently selected from primary, secondary, tertiary or quaternary organic ammonium compounds, including N-containing heterorings and ring systems, A and A' having independently from 1 to 60 carbons and 1 to 20 heteroatoms;

A$_1$ is an inorganic cation selected from Cs$^+$, Rb$^+$, K$^+$ and m is an integer from 1 to 3, each A$_l$ if m>1 being different;

B is an organic, bivalent cation selected from primary, secondary, tertiary or quaternary organic ammonium compounds having from 1 to 60 carbons and 2-20 heteroatoms and having two positively charged nitrogen atoms;

M is selected from Cu$^{2+}$, Ni$^{2+}$, Co$^{2+}$, Fe$^{2+}$, Mn$^{2+}$, Cr$^{2+}$, Pd$^{2+}$, Cd$^{2+}$, Ge$^{2+}$, Sn$^{2+}$, Pb$^{2+}$, Eu$^{2+}$, Yb$^{2+}$, [Sn$_i$Pb$_{(1-i)}$], [Sn$_j$Ge$_{(1-j)}$]$^+$, and [Pb$_k$Ge$_{(1-k)}$]$^+$, i, j and k being a number between 0.0 and 1.0;

N is selected from the group of Bi$^{3+}$ and Sb$^{3+}$; and,

X are independently selected from Cl$^-$, Br$^-$, I$^-$, NCS$^-$, CN$^-$, NCO$^-$, from [I$_{(3-m)}$Cl$_m$]$^-$, [I$_{(3-n)}$]$^-$, [Br$_{(3-u)}$Cl$_u$]$^-$, m, n u being a number between 0.0 and 3.0, and from a combination of two anions selected from Cl$^-$, Br$^-$, I$^-$.

10. The optoelectronic and/or photovoltaic or photoelectrochemical device according to claim 1, wherein said device is selected from an organic solar cell, a solid state solar cell, from a p-n heterojunction, a phototransistor or OLED (organic light-emitting diode).

11. The optoelectronic and/or photovoltaic or photoelectrochemical device of claim 1, wherein the spacer layer comprises a material selected from reduced graphene oxide, graphene oxide, graphene, Cr, and $Al_2O_3$.

* * * * *